US006750109B2

United States Patent
Culp et al.

(10) Patent No.: US 6,750,109 B2
(45) Date of Patent: Jun. 15, 2004

(54) HALO-FREE NON-RECTIFYING CONTACT ON CHIP WITH HALO SOURCE/DRAIN DIFFUSION

(75) Inventors: James A. Culp, Poughkeepsie, NY (US); Jawahar P. Nayak, Wappingers Falls, NY (US); Werner A. Rausch, Stormville, NY (US); Melanie J. Sherony, Wappingers Falls, NY (US); Steven H. Voldman, South Burlington, VT (US); Noah D. Zamdmer, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 10/064,305

(22) Filed: Jul. 1, 2002

(65) Prior Publication Data

US 2002/0149058 A1 Oct. 17, 2002

Related U.S. Application Data

(62) Division of application No. 09/589,719, filed on Jun. 8, 2000, now Pat. No. 6,429,482.

(51) Int. Cl.$^7$ .................. H01L 21/331; H01L 21/8238
(52) U.S. Cl. ................. 438/354; 438/204; 438/234
(58) Field of Search ................... 438/204, 234, 438/375, 291, 305, 289, 303, 530, 354

(56) References Cited

U.S. PATENT DOCUMENTS

| 5,578,506 A | | 11/1996 | Lin |
| 5,780,912 A | | 7/1998 | Burr et al. |
| 5,811,857 A | | 9/1998 | Assaderaghi et al. |
| 5,923,067 A | | 7/1999 | Voldman |
| 5,936,278 A | | 8/1999 | Hu et al. |
| 5,952,695 A | | 9/1999 | Ellis-Monaghan et al. |
| 5,959,335 A | | 9/1999 | Bryant et al. |
| 5,985,727 A | * | 11/1999 | burr ........................... 438/302 |
| 6,194,278 B1 | * | 2/2001 | Rengarajan ................. 438/302 |

* cited by examiner

Primary Examiner—Long Pham
Assistant Examiner—(Vikki) Hoa B. Trinh
(74) Attorney, Agent, or Firm—Anthony J. Canale

(57) ABSTRACT

A semiconductor chip includes a semiconductor substrate having a rectifying contact diffusion and a non-rectifying contact diffusion. A halo diffusion is adjacent the rectifying contact diffusion and no halo diffusion is adjacent the non-rectifying contact diffusion. The rectifying contact diffusion can be a source/drain diffusion of an FET to improve resistance to punch-through. The non-rectifying contact diffusion may be an FET body contact, a lateral diode contact, or a resistor or capacitor contact. Avoiding a halo for non-rectifying contacts reduces series resistance and improves device characteristics. In another embodiment on a chip having devices with halos adjacent diffusions, no halo diffusion is adjacent a rectifying contact diffusion of a lateral diode, significantly improving ideality of the diode and increasing breakdown voltage.

12 Claims, 6 Drawing Sheets

HALO-FREE NON-RECTIFYING CONTACT ON CHIP WITH HALO SOURCE/DRAIN DIFFUSION

BACKGROUND OF THE INVENTION

1. Field of the Invention

This invention generally relates to diffusions in devices on high performance semiconductor integrated circuit chips. More particularly, it relates to halo implants for such integrated circuit chips.

2. Background of the Invention

Symmetric and asymmetric halo implants have been suggested to improve performance of low power short channel length field effect transistors (FET) by improving resistance to punch through. Symmetric halo implants are pockets of increased dopant concentration of the same conductivity type as the channel region in areas adjacent to the FET source and drain edges. Each of these FET halo implants is doped opposite to the adjacent source/drain diffusion. Asymmetric halo implants extend adjacent to either the source or the drain or they may extend differently adjacent the source than adjacent the drain. Halo implants may also extend into or under the channel region adjacent the source or drain edges. It is believed that further improvement of halo implants are attainable that will provide further improvement in device and chip performance, and one solution is provided by the following invention.

BRIEF SUMMARY OF THE INVENTION

It is an object of the present invention to avoid a halo implant on non-rectifying contacts of devices on chips having FET devices with halo implants.

It is a further object of the present invention to avoid a halo implant on non-rectifying contacts of gate conductor defined resistors, capacitors, lateral diodes, lateral SOI diodes, and FET body contacts on chips having FET devices with halo implants.

It is a feature of the present invention that no special mask is needed to avoid halo implants on non-rectifying contacts.

It is a another feature of the present invention that a lateral SOI gated diode, such as those used for overshoot/undershoot clamping, ESD protection, and temperature sensing, has no halo diffusion in one or both diffusion contacts.

It is an advantage of the present invention that the avoidance of halo implants on non-rectifying contacts improves series resistance and performance of devices on integrated circuits having FETs with halo implants.

It is another advantage of the present invention that the avoidance of halo implants on non-rectifying contacts improves yield of integrated circuit chips having FETs with halo implants.

These and other objects, features, and advantages of the invention are accomplished by a semiconductor chip, comprising a semiconductor substrate. A rectifying contact diffusion and a non-rectifying contact diffusion are in the substrate. A halo diffusion is adjacent the rectifying contact diffusion and no halo diffusion is adjacent the non-rectifying contact diffusion.

The structures are suitable for forming body contacts to FETs, lateral diodes, resistors, and capacitors on chips having FETs with halos adjacent source or drain diffusions. The structures are particularly suitable for SOI chips but may also be used for bulk silicon chips.

BRIEF DESCRIPTION OF THE SEVERAL VIEWS OF THE DRAWINGS

The foregoing and other objects, features, and advantages of the invention will be apparent from the following detailed description of the invention, as illustrated in the accompanying drawings, in which:

FIG. 2b is a cross sectional view through the device of FIG. 2a;

DETAILED DESCRIPTION OF THE INVENTION

The present inventors discovered that halo implants used to avoid punch through on field effect transistor (FET) devices can degrade performance of devices if the halo implants are also provided adjacent non-rectifying or ohmic contacts. A non-rectifying contact is used, for example as a body contact to the FET. A non-rectifying contact is also used for a gate conductor defined lateral diode ohmic contact. It can also be used for gate conductor defined diffusions for resistors and capacitors that have the same doping as the semiconductor body underlying gate conductor. Contacts are made to such diffusions to provide a non-rectifying contact to a body region underlying gate conductor or to provide a resistive path to another non-rectifying contact to the body. In these cases the halo implants would be oppositely doped to both the diffusions and to the body region under the gate.

The inventors found that oppositely doped halo regions introduce an undesired rectifying region in parallel with the ohmic contact. The halo also interferes with the body contact by reducing the area of ohmic contact or by blocking the ohmic contact. The halo implants therefore also increase series resistance between the non-rectifying or ohmic contact and the body or channel region of the device. For FETs control of the body potential is thereby degraded, and that degrades control over threshold voltage. This reduces functional test yield and adds to cost of making integrated circuit chips.

Figure 1A:
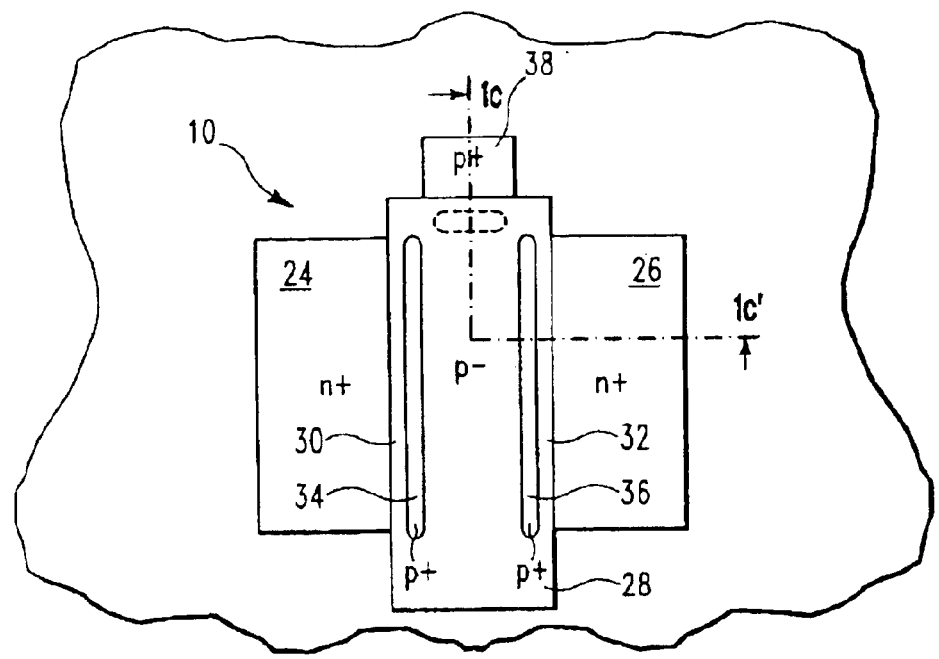
FIG. 1a is a top view of an FET of the present invention in which the FET has source/drain diffusions and a body contact adjacent a gate, in which the source/drain diffusions have halo implants but the body contact does not.
Figure 1B:
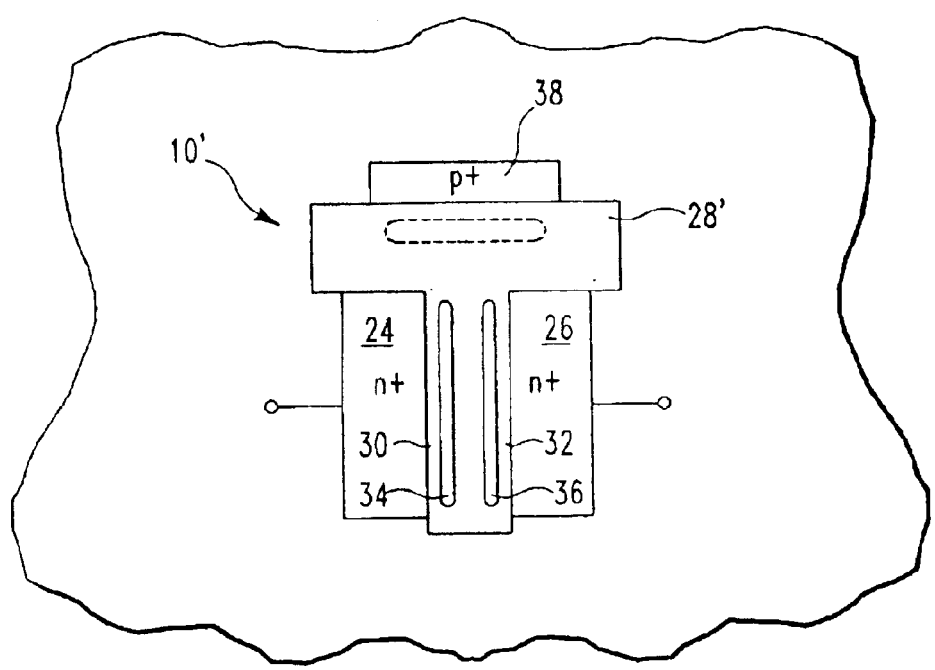
FIG. 1b is a top view of an FET similar to the FET of FIG. 1a, but with a T-shaped gate.

The invention provides halo implants adjacent rectifying diffusions, such as source/drain diffusions of FETS while not providing halo implants for non-rectifying diffusions, such as body contacts to FETS, lateral diodes, and gate defined resistors and capacitors. FET 10 and FET 10' are formed on SOI body 12 on back insulator 14 on bulk substrate 16, as shown in top view in FIGS. 1a, 1b and in bent cross sectional view in FIG. 1c. FET 10 includes source/drain diffusions 24, 26 adjacent gate 28 or T-shaped gate 28' on gate dielectric 29.

In this application a later applied layer may be "on" another layer even if there is an intervening layer and regardless of the orientation the substrate, wafer, or chip is held.

FET 10 also includes extension diffusions 30, 32 and halo diffusions 34, 36, adjacent source/drain diffusions 24 and body contact 38. Halo diffusions 34, 36 are oppositely doped from adjacent source/drain diffusions 24.

Figure 1C:
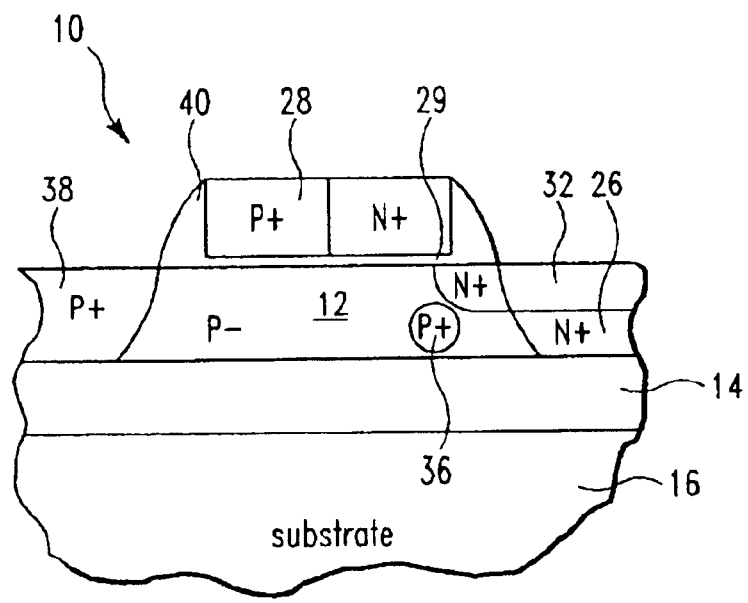
FIG. 1c is a bent cross sectional view through the device of FIG. 1a along line 1c–1c'.

No halo diffusion doped oppositely to body 12 and body contact 38 is provided adjacent body contact 38, substantially reducing series resistance and performance degradation that would result from inclusion of a halo there, as shown in FIG. 1c.

In addition the extension diffusion for body contact 38 is omitted. The extension and halo implants are provided in the same masking step earlier in the process than the source drain diffusion. The extension is the same doping type as the source/drain doping but is closer to the surface and extends under more of the gate. The extension implant is usually provided with the ion beam aiming along a normal to the wafer surface. The halo implant may be aimed normal to the surface or at an angle to provide ions under gate 28. Alternatively part of the halo dose may be provided normal and part at an angle.

In forming diffusions for FETs on CMOS chips, typically four masks are used. One mask is used for both the halo and extension implants for p channel devices. This mask blocks n channel devices. A second mask is used for both the halo and extension diffusions for n channel devices. This mask blocks p channel devices. Then spacer 40 is provided along sidewalls of gate 28. A third mask is used for the source/drain deep diffusions for the p channel devices. This mask blocks n channel devices. A fourth mask is then used for the source/drain deep diffusions for the n channel devices. This mask blocks p channel devices. The present invention redesigns the two halo and extension masks to add non-rectifying contacts for FET body contacts, lateral diodes, and gate defined resistors and capacitors to the list of locations being blocked by the two halo and extension masks. To provide the extension but not the halo on body contacts would require another mask. That is why both halo and extension implants are blocked. An additional mask could be used to provide the extension while leaving the halo blocked.

In the process a blocking mask has a blocking region over the location of a non-rectifying diffusion contact. This non-rectifying diffusion contact is defined by data on at least one other mask, and typically as many as three masks are needed to define the non-rectifying diffusion contact. The blocking region on the blocking mask is generated from the data on those other masks. The blocking region on the blocking mask is generated from the data on the three other masks by logically combining shapes from those three other masks and adjusting the result to avoid sublithographic features from being formed on the blocking mask. Sublithographic features include notches and slivers having a dimension that is less than the smallest dimension that can be resolved by the photolithographic process. The design of the blocking region is critical to keeping the halo out of the non-rectifying diffusion contacts while not being so big that it blocks the halo implant where needed.

Figure 2A:
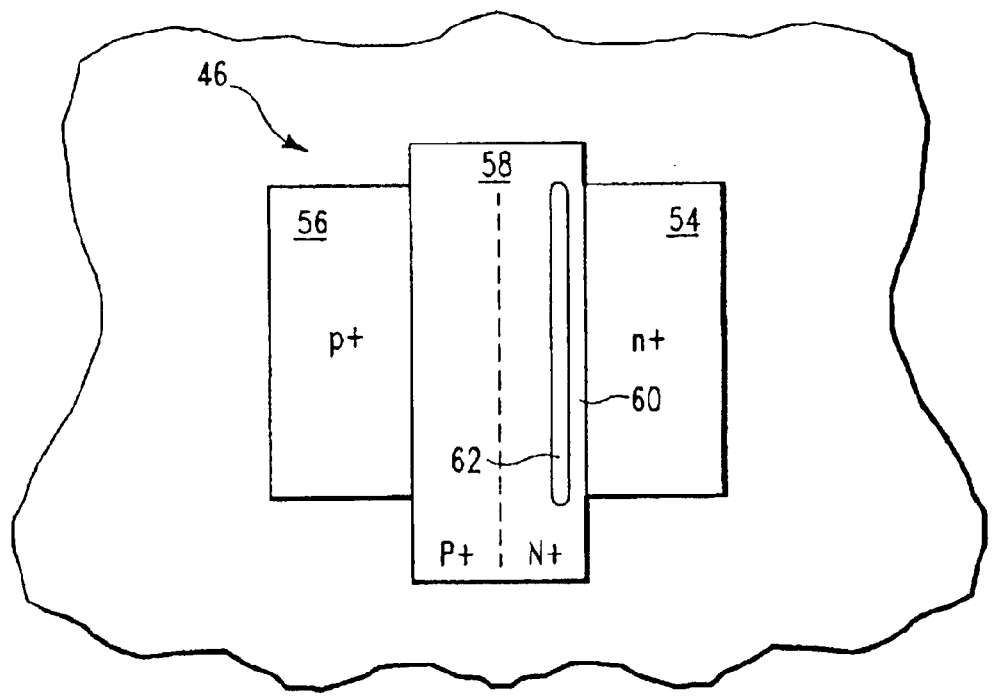
FIG. 2a is a top view of a lateral diode of the present invention in which the diode has a rectifying diffusion and a non-rectifying diffusion adjacent gate conductor, in which the rectifying diffusion has a halo implant but the non-rectifying diffusion does not.
Figure 2B:
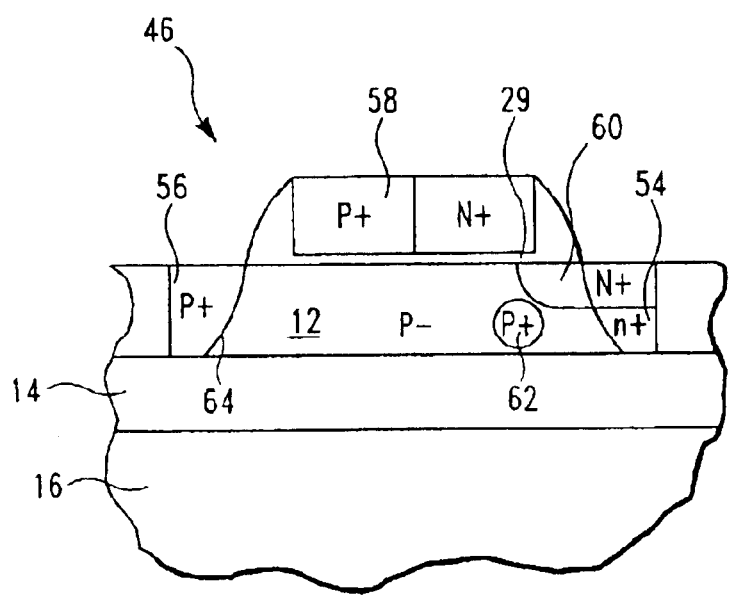
Figure 3A:
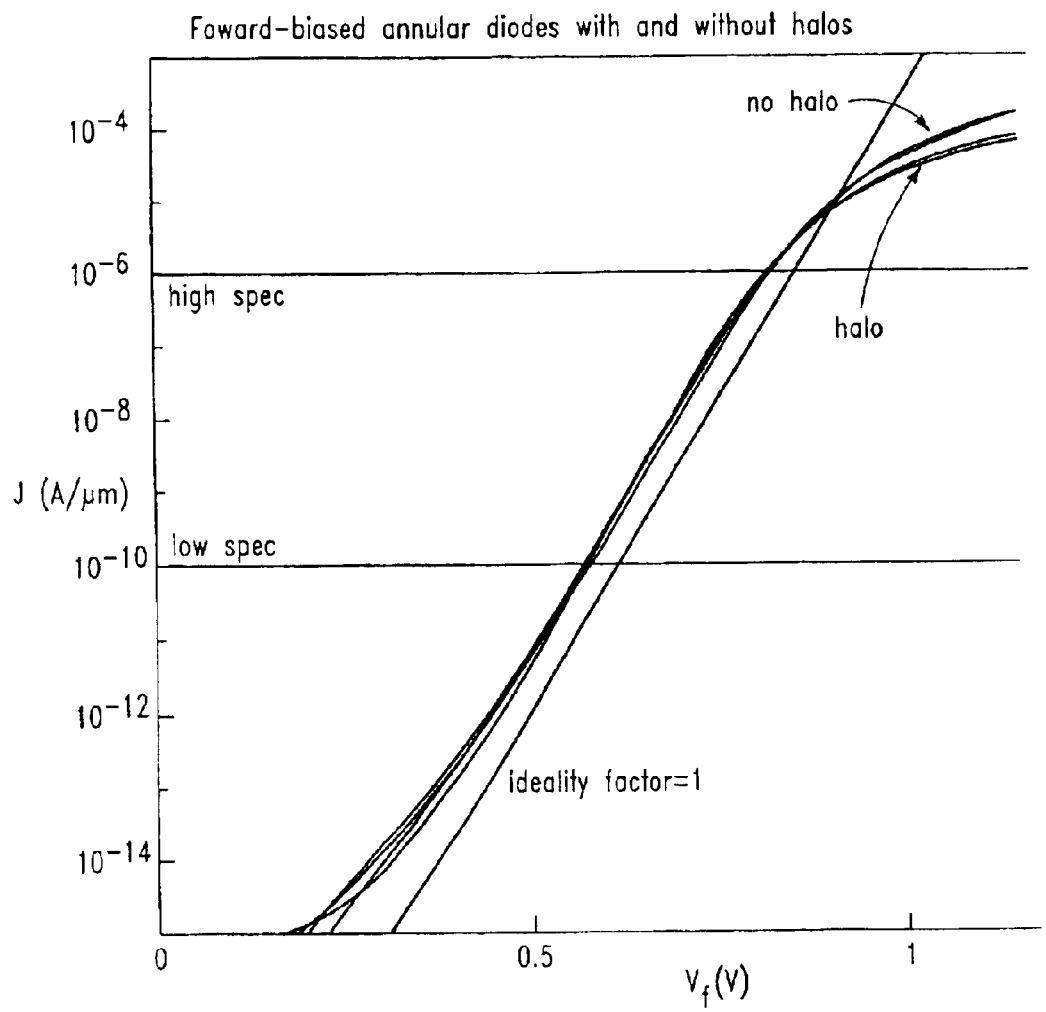
FIG. 3a is a graph of I–V characteristics comparing forward biased diodes with and without halo implants adjacent the non-rectifying diffusions.
Figure 3B:
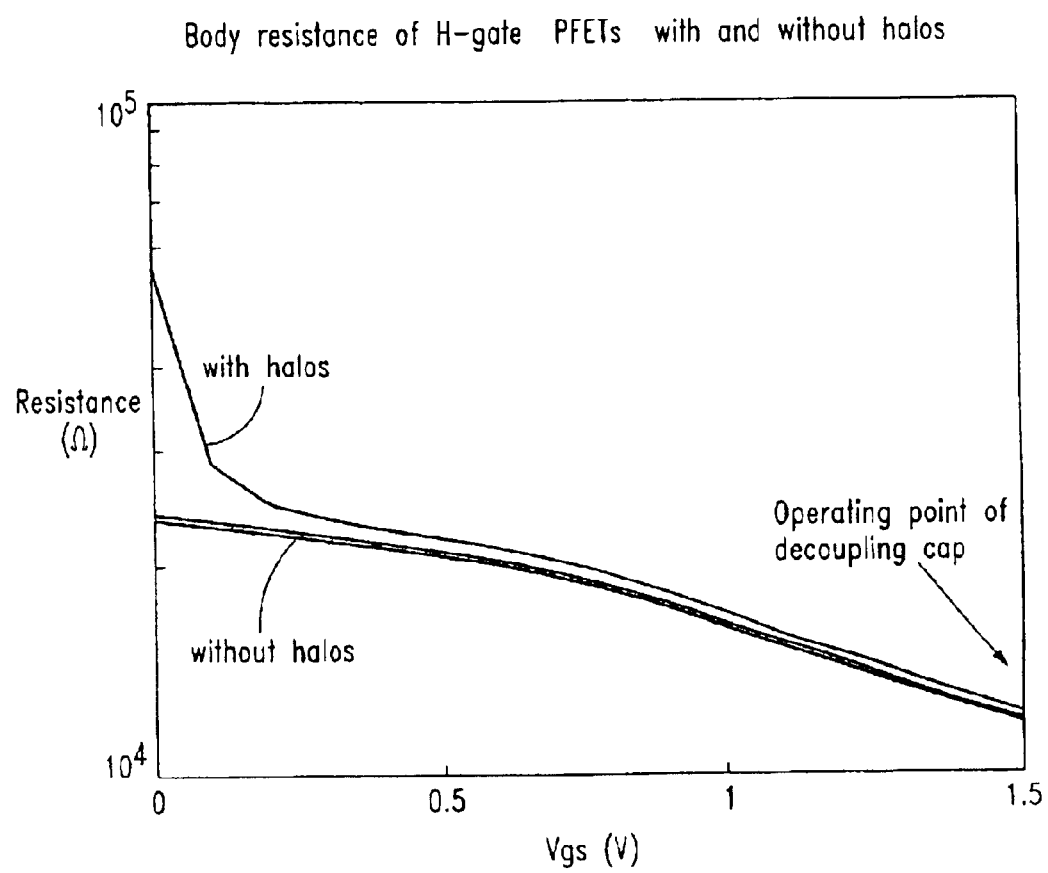
FIG. 3b is a graph of resistance v. gate to source voltage, showing the irregular change in resistance for SOI FETS with a halo implant adjacent the non-rectifying body contact diffusion.

In another embodiment of the invention, lateral diode 46 is formed on silicon-on-insulator (SOI) body 12 on back insulator 14. Diode 46 includes rectifying diffusion 54 and non-rectifying diffusion 56, both adjacent gate conductor 58, as shown in top view in FIG. 2a and in cross sectional view in FIG. 2b. Lateral diode 46 can be used for purposes such as a phase lock loop circuit, an electrostatic discharge (ESD) protection device, an over voltage clamping network, or a temperature sensing device. Gate conductor 58 is formed of the same material as FET gate 28 but does not serve a gate function for a lateral diode. Rectifying diffusion 54 has extension implant 60 and halo diffusion 62. Non-rectifying diffusion 56 has abrupt p+ to p− ohmic contact region 64 with no halo implant, substantially improving series resistance of diode 46, as shown in FIGS. 3a and 3b. In addition, the simplest process for implementing the invention also eliminates an extension implant at non-rectifying diffusion 56. If desired, with an additional mask, an extension implant (not shown) can be provided along with diffusion 56.

Figure 2C:
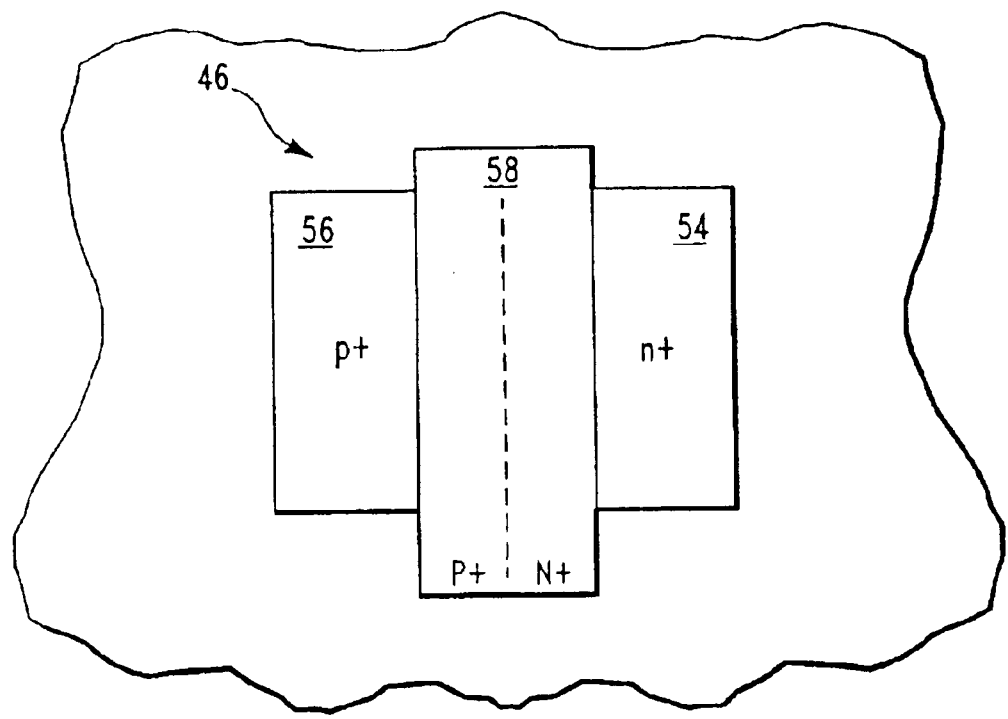
FIG. 2c is a top view of a lateral diode of the present invention in which the diode includes a rectifying diffusion and a non-rectifying diffusion adjacent gate conductor, in which neither the rectifying diffusion nor the non-rectifying diffusion has a halo implant.

In yet another embodiment of the invention, halo implants are included adjacent FET source drain diffusions but lateral diode 46' has halo implant 62 omitted from being placed adjacent both rectifying diffusion 54' and non-rectifying diffusion 56, as shown in FIG. 2c. Eliminating halo implant 62 from being implanted adjacent rectifying diffusion 54' increases diode breakdown voltage, reduces diode forward leakage, improves diode ideality factor and improves linearity of the exponential IV characteristic. Thus, diode 46' could better serve several functions on chip, such as temperature measurement and ESD protection. The halo is eliminated from being implanted adjacent rectifying diffusion 54' by blocking the implant on the halo and extension masks described herein above.

Figure 4A:
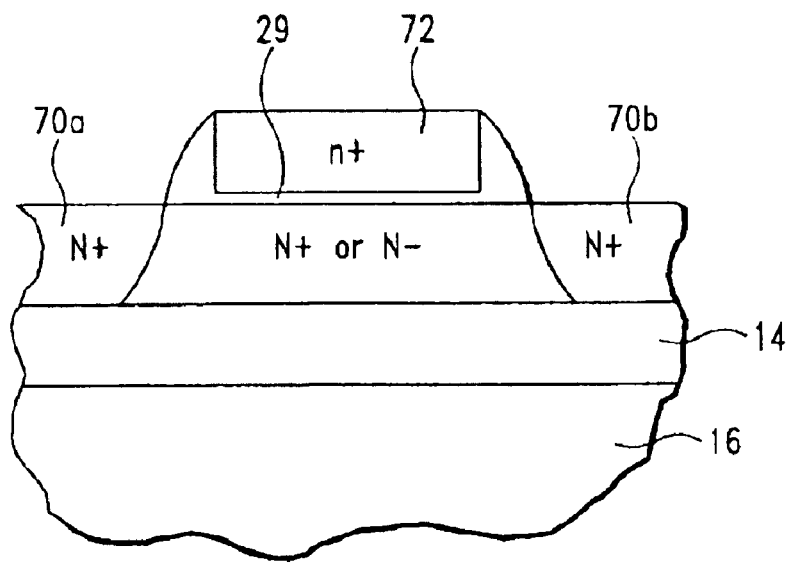
FIG. 4a is a cross sectional view of a device of the present invention in which the device has two non-rectifying junctions without halo implants adjacent gate conductor, in which the device can serve as a resistor or as a capacitor.
Figure 4B:
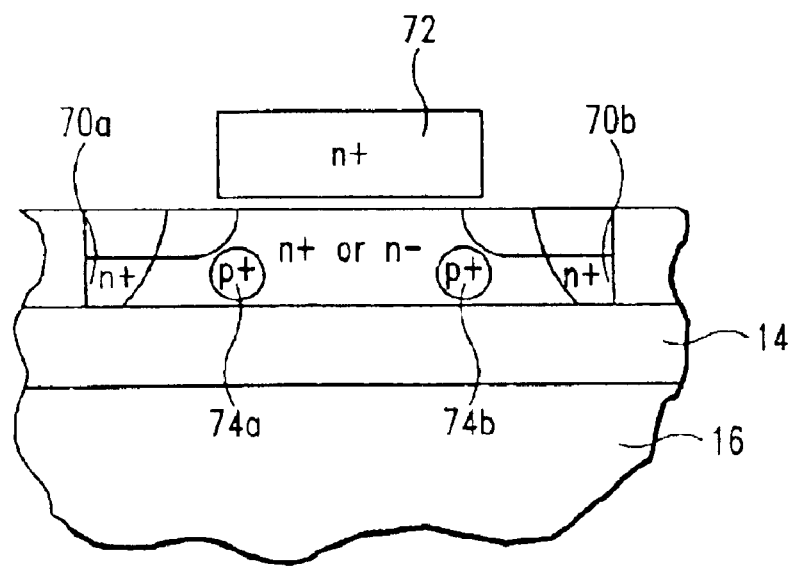
FIG. 4b is a cross sectional view of a prior art device having two non-rectifying junctions with halo implants in which the device can serve as a resistor or as a capacitor.

In yet other embodiments of the invention, resistors and capacitors are formed without halo implants adjacent diffusions 70a, 70b, as shown in FIG. 4a. These resistors or capacitors are formed by providing diffusions adjacent gate conductor 72 on chips that have FETs with the halo implants (see FIGS. 1a, 1b). By comparison, if resistors and capacitors are formed with halo implants 74a, 74b, adjacent gate conductor 72, as shown in prior art FIG. 4b, series resistance is higher and a substantial voltage dependance for that additional series resistance is introduced. The end result has been degraded chip performance. Devices of FIGS. 4a, 4b are resistors when voltage is provided between contacts to diffusion 70a and diffusion 70b. The devices are capacitors when a voltage is provided to contacts between gate conductor 72 and diffusions 70a, 70b. If desired, with an extra mask, extension implants (not shown) can be provided along with diffusions 70a, 70b.

While several embodiments of the invention, together with modifications thereof, have been described in detail herein and illustrated in the accompanying drawings, it will be evident that various further modifications are possible without departing from the scope of the invention. For example, opposite doping types to those illustrated are also covered. The invention is also applicable to double gated FETS in bulk and in SOI technologies. Nothing in the above specification is intended to limit the invention more narrowly than the appended claims. The examples given are intended only to be illustrative rather than exclusive.

What is claimed is:

1. A method of fabricating a semiconductor chip, comprising the steps of:

(a) providing a semiconductor substrate comprising a first dopant type at a first dopant level;

(b) forming a rectifying diffusion contact in said substrate;

(c) forming a non-rectifying diffusion contact in said substrate, said non-rectifying diffusion contact having a second dopant level different than the first dopant level; and (d) forming a halo diffusion adjacent said rectifying diffusion contact and forming no halo diffusion adjacent said non-rectifying diffusion contact.

2. A method as recited in claim 1, wherein in said forming step (b) said rectifying diffusion is a source/drain diffusion of an FET, wherein in said forming step (c) said non-rectifying contact is a body contact for said FET.

3. A method as recited in claim 1, wherein said non-rectifying diffusion contact is an electrode of a lateral diode.

4. A method as recited in claim 3, wherein said lateral diode is for ESD protection, overshoot/undershoot protection, or over voltage clamping.

5. A method as recited in claim 3, wherein in said forming step (b) said rectifying diffusion is a source/drain diffusion of an FET or a second electrode of said lateral diode.

6. A method as recited in claim 1, wherein in said forming step (b) said rectifying diffusion is a source/drain diffusion of an FET, wherein said forming step (c) comprises forming a device having a pair of said non-rectifying diffusion contacts and wherein said step (d) comprises forming no halo diffusion adjacent either of said non-rectifying contacts.

7. A method as recited in claim 6, wherein said device comprises a resistor or a capacitor.

8. A method as recited in claim 1, wherein in said forming step (a) said substrate comprises SOI.

9. A method as recited in claim 1, further comprising forming an extension diffusion adjacent said rectifying contact diffusion and forming no extension diffusion adjacent said non-rectifying contact diffusion.

10. A method as recited in claim 1, wherein said forming step (d) comprises providing a first mask including a location of a non-rectifying diffusion contact, wherein said first mask has a blocking region over said location.

11. A method an recited in claim 10, wherein said non-rectifying diffusion contact is defined by data on at least one other mask, and wherein said blocking region on said first mask is generated from said data.

12. A method as recited in claim 11, wherein said blocking region on said first mask is generated from said data by logically combining shapes from a plurality of masks and adjusting the result to avoid sublithographic features.

* * * * *